(12) United States Patent
Hall et al.

(10) Patent No.: US 10,573,803 B1
(45) Date of Patent: Feb. 25, 2020

(54) CURRENT SENSOR PACKAGES WITH THROUGH HOLE IN SEMICONDUCTOR

(71) Applicant: SEMICONDUCTOR COMPONENTS INDUSTRIES, LLC, Phoenix, AZ (US)

(72) Inventors: Jefferson W. Hall, Chandler, AZ (US); Michael J. Seddon, Gilbert, AZ (US); Yenting Wen, Chandler, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 16/106,638

(22) Filed: Aug. 21, 2018

(51) Int. Cl.
| | | |
|---|---|---|
| *H01L 43/04* | (2006.01) | |
| *H01L 43/06* | (2006.01) | |
| *H01L 43/14* | (2006.01) | |
| *G01R 19/00* | (2006.01) | |
| *G01R 15/18* | (2006.01) | |
| *G01R 15/20* | (2006.01) | |
| *G01R 31/28* | (2006.01) | |

(52) U.S. Cl.
CPC ............ *H01L 43/04* (2013.01); *G01R 15/181* (2013.01); *G01R 15/202* (2013.01); *G01R 19/0092* (2013.01); *G01R 31/2853* (2013.01); *H01L 43/065* (2013.01); *H01L 43/14* (2013.01)

(58) Field of Classification Search
CPC ....... H01L 43/04; H01L 43/14; H01L 43/065; G01R 15/181; G01R 31/2853; G01R 15/202; G01R 19/0092
See application file for complete search history.

(56) References Cited

U.S. PATENT DOCUMENTS

| | | | | |
|---|---|---|---|---|
| 5,487,214 A | * | 1/1996 | Walters | H01F 17/0006 29/602.1 |
| 6,989,665 B2 | * | 1/2006 | Goto | G01R 15/202 324/117 H |
| 7,486,167 B2 | * | 2/2009 | Loke | H01L 23/5227 336/200 |
| 7,795,728 B2 | * | 9/2010 | Przadka | H03H 9/0542 257/723 |
| 7,843,302 B2 | * | 11/2010 | Mano | H01F 17/0006 336/200 |
| 7,956,713 B2 | * | 6/2011 | Chandrasekhar | H01F 17/0033 174/266 |
| 8,227,706 B2 | * | 7/2012 | Roy | H05K 1/0222 174/262 |
| 9,618,588 B2 | * | 4/2017 | Ausserlechner | G01R 33/09 |
| 10,041,978 B2 | * | 8/2018 | Salles | H01L 25/065 |

(Continued)

FOREIGN PATENT DOCUMENTS

EP 2672282 A1 12/2013

*Primary Examiner* — John P. Dulka
(74) *Attorney, Agent, or Firm* — Brake Hughes Bellermann LLP

(57) ABSTRACT

A semiconductor package includes a semiconductor die. A through hole in the semiconductor package and semiconductor die extends from one side of the semiconductor package and die to an opposite side of the semiconductor package and die. The through hole is configured to receive a current-carrying conductor there through. At least one current sensor is formed in, or on, the semiconductor die and configured to sense current flow in the current-carrying conductor received in the through hole.

24 Claims, 18 Drawing Sheets

(56) References Cited

U.S. PATENT DOCUMENTS

| | | | |
|---|---|---|---|
| 2003/0067002 A1* | 4/2003 | Fischer | G11C 29/006 257/48 |
| 2003/0137388 A1* | 7/2003 | Meier | G01R 15/181 336/225 |
| 2004/0080308 A1* | 4/2004 | Goto | G01R 15/202 324/117 H |
| 2006/0181264 A1* | 8/2006 | Catona | G01R 15/207 324/126 |
| 2006/0202291 A1* | 9/2006 | Kolb | H01L 27/22 257/421 |
| 2006/0290002 A1* | 12/2006 | Arana | H01L 21/76898 257/774 |
| 2009/0079530 A1* | 3/2009 | Chandrasekhar | H01F 17/0033 336/200 |
| 2010/0156394 A1* | 6/2010 | Ausserlechner | G01R 15/202 324/144 |
| 2010/0176793 A1* | 7/2010 | Michalak | G01R 31/2884 324/117 H |
| 2012/0049304 A1 | 3/2012 | Motz et al. | |
| 2012/0146164 A1* | 6/2012 | Ausserlechner | G01R 15/202 257/421 |
| 2012/0146165 A1* | 6/2012 | Ausserlechner | G01R 15/202 257/421 |
| 2013/0058143 A1 | 3/2013 | Tachibana | |
| 2014/0015516 A1* | 1/2014 | Sorensen | G01R 19/00 324/127 |
| 2015/0309127 A1* | 10/2015 | Ausserlechner | G01R 33/09 324/252 |
| 2015/0369845 A1 | 12/2015 | Salles et al. | |
| 2016/0218276 A1* | 7/2016 | Chen | B29C 45/14 |
| 2016/0258996 A1* | 9/2016 | Lim | G01R 19/16533 |
| 2017/0003320 A1* | 1/2017 | Tsujimoto | G01R 1/22 |
| 2017/0059648 A1* | 3/2017 | Woo | G01R 31/2884 |
| 2017/0062294 A1* | 3/2017 | Nasrullah | H01L 22/34 |
| 2017/0108362 A1* | 4/2017 | Engel | G01R 33/1269 |
| 2018/0019259 A1* | 1/2018 | Hall | H01L 21/76275 |
| 2018/0052191 A1* | 2/2018 | Kern | G01R 15/181 |

* cited by examiner

400

Disposing a current sensor in a semiconductor die, the semiconductor die having a pass through hole extending from one side of the semiconductor die to another side of the semiconductor die

1010

Placing the semiconductor die about the conductor wire with the conductor wire passing through the hole in the semiconductor die from the one side of the semiconductor die to the another side of the semiconductor die

1020

Detecting, by the current sensor in the semiconductor die, a voltage signal proportional to current flow in the conductor wire passing through the hole in the semiconductor die

CURRENT SENSOR PACKAGES WITH THROUGH HOLE IN SEMICONDUCTOR

TECHNICAL FIELD

This description relates to current sensor packages for monitoring current flow in electronic circuits.

BACKGROUND

In many semiconductor device and circuit applications (e.g., power circuits such as invertors, switches, transformers, etc.), it is desirable to measure current flows through the semiconductor devices and circuits. Semiconductor device and circuit packages are become smaller and smaller (e.g., because of increasing miniaturization). For example, many high voltage electronics packages or systems ("HV systems") are now size, space or weight constrained. Compact alternating current (AC) and direct current (DC) sensors are required, which minimize power losses in the system while improving measurement accuracy. Apart from the size and performance requirements for use with HV systems, the current sensors are also constrained to function under conditions of HV galvanic isolation.

BRIEF DESCRIPTION OF THE DRAWINGS

FIG. 10 illustrates an example method for sensing current flow in a conductor wire.

DETAILED DESCRIPTION

Figure 1:
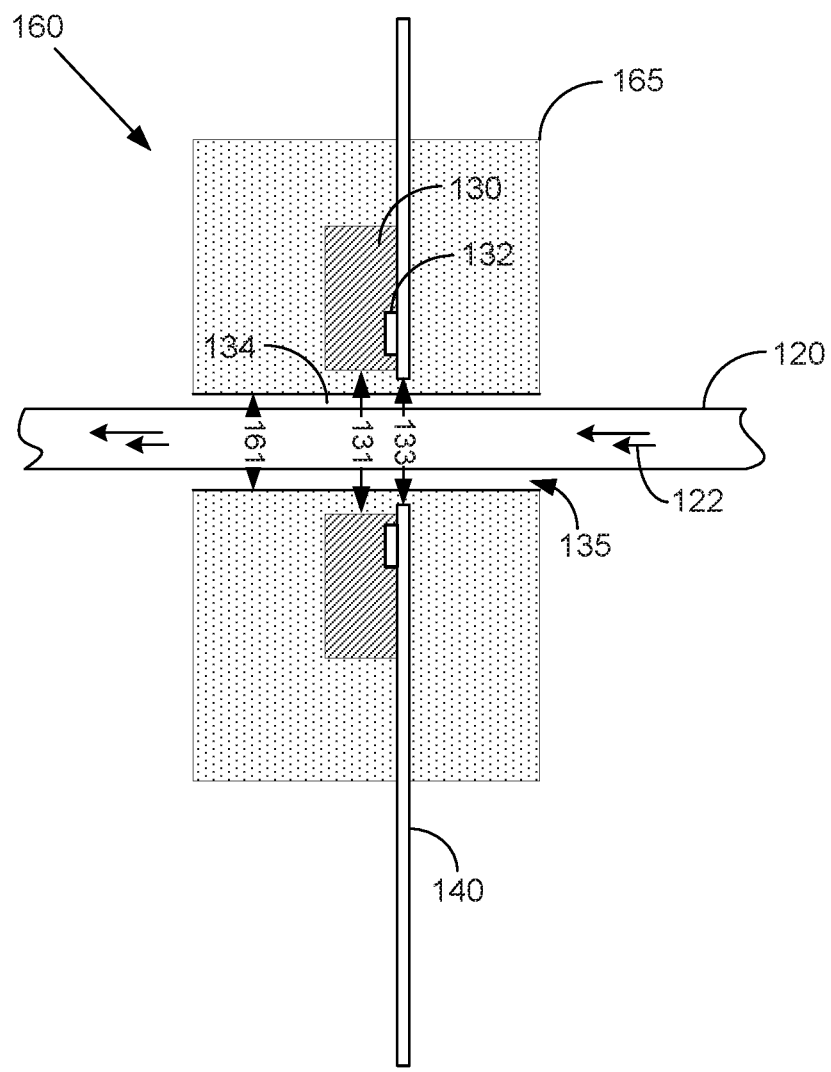
FIG. 1 is a block diagram illustrating an example sensor package configured for sensing current flow in a current-carrying conductor.

In general, a semiconductor device and/or circuits package is a metal, plastic, epoxy, glass and/or ceramic casing containing one or more semiconductor electronic and/or circuit components. Individual discrete components are typically disposed in and/or on a semiconductor substrate (e.g., a silicon wafer, semiconductor region and/or epitaxial layer(s)) before being cut as a die and assembled (e.g., molded) in a package. The package provides protection against impact and corrosion, and holds the contact pins and/or leads that are used to connect from external circuits to the die and dissipate heat produced in the package.

Compact semiconductor device and/or circuit packages (sensor packages) that include current sensors are described herein. The sensor packages may be used for measuring current flow in other circuits (host circuits). The sensor packages may be configured, for example, to sense current flowing in current-carrying input and/or output wires of the host circuits. The host circuits may include, for example, electronic circuits for inverters, power distribution, starter-generators, servo-regulators, line connected power supplies, solar energy power supplies, uninterruptible power supply (UPS), robotics, etc.

A sensor package may be included in, and/or integrated with, a host circuit. In example implementations, the sensor package may be mounted on a circuit board of the host circuit. The sensor package may be disposed on the circuit board of the host circuit to sense current flowing in a current-carrying input and/or output wire of the host circuit having, for example, an input and/or output terminal at the circuit board.

The sensor package (including the current sensor) may help in providing galvanic isolation between the electrical components and functions of the semiconductor devices and electronic components in the host circuit.

A compact current sensor may be formed in, and/or supported on, a semiconductor substrate (e.g., a silicon wafer, semiconductor region and/or epitaxial layer(s)) or made of other solid state materials. The current sensors may include any type of current sensors including, for example, Hall effect sensors, inductive current sensors (e.g., Rogowski current sensors), flux gate sensors, etc.

Sensor packages that include one or both of two or more types of compact current sensors (namely, Hall effect current sensors and Rogowski current sensors) are described in further detail herein. The current sensors described herein may be included in, supported on, or coupled to the semiconductor die.

A Hall effect current sensor may be based on the Hall Effect (i.e., the production of a voltage difference (the Hall effect voltage) across a current carrying sensor element (e.g., a Hall slab or plate) in presence of a magnetic field, the voltage difference being perpendicular to both current and the magnetic field). A Hall effect current sensor includes integrated circuits that sense current flow in a current-carrying conductor by measuring the proportional magnetic field generated by the current flow in the current-carrying conductor. The Hall effect current sensor may be used to sense direct current (DC) flowing through the current-carrying conductor (that produces the proportional magnetic field).

A Hall effect current sensor including one or more current sensor elements (e.g., Hall slabs or plates) may be fabricated, for example, by dopant diffusion, in a semiconductor die. Depending on an orientation of the current sensor elements (e.g., Hall slabs or plates) relative to the orientation of the semiconductor die (and the direction of current flow in the current-carrying conductor), the Hall effect current sensor may be referred to, for example, as a horizontal Hall effect current sensor or a vertical Hall effect current sensor.

In a horizontal Hall effect current sensor, a current sensor element (e.g., a Hall slab or plate) may be generally aligned parallel to the major surfaces of the semiconductor die and configured to sense current flow components parallel to the major surfaces of the semiconductor die. The Hall slab or plate of the horizontal Hall effect current sensor may be formed, for example, by shallow dopant diffusions into the semiconductor material of the semiconductor die.

In a vertical Hall effect current sensor, a current sensor element (e.g., Hall slab or plate) may be generally aligned perpendicular to the major surface of the semiconductor die and configured to sense current flow components normal to the major surfaces of the semiconductor die. The Hall slab or plate of the vertical Hall effect current sensor may be formed, for example, by deep dopant diffusions into the semiconductor material of the semiconductor die. A vertical Hall effect current sensor may include two such vertically oriented Hall slab or plates, oriented orthogonally to one another, to provide three axis sensing capability (or to account for current flow that is not perfectly normal to the major surfaces of the semiconductor die).

An inductive current sensor (e.g., a Rogowski current sensor) may involve measurements of voltages induced in a Rogowski coil (i.e., a helical coil wrapped around a conductor in which a current is flowing) to sense alternating current (AC) flowing through the conductor. The Rogowski current sensor includes integrated circuits that sense current flow in a current-carrying conductor by measuring the proportional voltages induced in the Rogowski coil.

In example implementations, a current sensor described herein is deployed to sense and measure current flow in a conductor (i.e., a current-carrying conductor) in situ in the host circuit. The current-carrying conductor may be an internal conductor (e.g., a wire connecting two internal components in the host circuit) or may be an internal-external conductor (e.g., an input and/or output wire extending to the outside of the host circuit package and/or circuit board).

In example implementations, a current sensor described herein (e.g., a Hall effect current sensor, or a Rogowski current sensor) is fabricated on a semiconductor die, which is included in the sensor package. A Hall effect current sensor may, for example, include a set of high density coils (and optional ferro magnetic core) attached to a top surface of the semiconductor die. A Rogowski current sensor may, for example, include a set of Rogowski coils disposed or formed on the top surface of the semiconductor die.

In example implementations, the semiconductor die of the current sensor (semiconductor die) may be placed next to, surround, or enclose the current-carrying conductor in which current flow is to be sensed or monitored. The semiconductor die may be packaged in a sensor package (e.g., a TO-220 style electronic component package). In example implementations, the sensor package (and the semiconductor die) may include an opening (e.g., a pass through hole) extending across the sensor package from one side of the sensor package to the other side of the sensor package. The current-carrying conductor may be disposed in the pass through hole to be next to, or surrounded by, the semiconductor die.

FIG. 1 is a block diagram illustrating a cross sectional view of an example current-sensor semiconductor die (e.g., semiconductor die 130) packaged (e.g., molded) in a sensor package 160. Sensor package 160 may, for example, be a chip package (e.g., a TO-220 package) including semiconductor die 130 with lead frames (e.g., lead frame 140) that can carry signals from the die to the outside. Semiconductor die 130 may be coupled to a current sensor 132 (e.g., a Hall effect current sensor, a Rogowski current sensor). Semiconductor die 130 has an opening or pass through hole 131 (also can be referred to as an opening) that extends from one side of the semiconductor die to an opposite side of the semiconductor die 130 (such that the pass through hole 131 is aligned along a line orthogonal to (or normal to) a primary plane aligned along a major surface of semiconductor die 130). Pass through hole 131 may include, or be otherwise aligned with, a corresponding pass through hole 133 in lead frame 140 attached to semiconductor die 130. Sensor package 160 has an opening or pass through hole 161 (also can be referred to as an opening) that extends from one side of the sensor package to an opposite side of the sensor package. Holes 131 and 161 may have the same or different cross-sectional shapes and/or sizes (e.g., different or the same cross-sectional diameters). Pass through hole 131 in the semiconductor die (and pass through hole 133 in lead frame 140) may be aligned (e.g., coaxially aligned) with pass through hole 161 so that a current-carrying conductor (e.g., a wire 120) can extend from one side of the sensor package to the other side of the sensor package via pass through holes 131, 133 and 161. The sizes (e.g., diameters) of the pass through holes may be larger than a size (e.g., diameter) of wire 120 to provide a clearance (e.g., air gap 135) between the hole sidewalls and the diameter of wire 120 so that wire 120 can be threaded through the holes from one side of the sensor package to the other side of the sensor package. Wire 120 threaded through the holes in the sensor package may, for example, carry a current (e.g., current 122) which can be sensed and/or monitored by the current sensor in semiconductor die 130.

Semiconductor die 130 (including the active and passive integrated circuit elements and the physical holes therein) and current sensor package 160 may be fabricated using processes that are the same as, or similar to, semiconductor device fabrication and packaging processes used in the microelectronics industry. In example implementation, several semiconductor die may be fabricated on a silicon wafer. The silicon wafer may be diced or singulated (e.g., using plasma singulation, or laser cutting) to pick up individual semiconductor die 130, which may be then packaged in current sensor package 160. In current sensor package 160, a mold compound (e.g., epoxy 165) may cover or coat exposed surfaces semiconductor die 130. Epoxy 165 may, in some instances, coat or line the sidewalls of pass through hole 131, 133, and 161 to a thickness that leaves clearance for threading wire 120 through the holes.

In example implementations, the current sensor package 160 may be mounted on a same circuit board as the host circuit. In such implementations, current sensor package 160 (and semiconductor die 130 and current sensor 132 therein) is galvanically isolated from the current-carrying conductor (e.g., wire 120). Wire insulation and/or other insulating material 134 (e.g., disposed in hole 131 of semiconductor die 130) may galvanically isolate the current-carrying conductor from the current sensor, the semiconductor die, and the current sensor package).

In example implementations, semiconductor die of the current sensor may include signal processing circuits (e.g., amplifiers, integrators, summers, etc.) for processing signals (e.g., Hall effect voltage signals) sensed by the current sensor. In example implementations an output of the current sensor (e.g., a voltage differential from a Hall effect sensor) may be used as feedback, for example, to control operation of the host circuit.

An example sensor package deployment includes a current carrying conductor disposed at least partially through the sensor package (e.g., through a hole in the sensor package). A current sensor is disposed in the sensor package and configured to sense current flow in the current carrying conductor. Electrical insulation is disposed between the current carrying conductor and the sensor package. The electrical insulation confines current flow in the current carrying conductor to the current carrying conductor and blocks passage of current flow from the current carrying conductor (e.g., by leakage) to conductive pathways (metallization and conductive interconnections) of the sensor package itself.

FIGS. 2A, 3A, 4A, 5A, 6A, 7A, 8A, and 9A are cross sectional views of current sensor packages deployed to sense current flowing a conductor wire, and FIGS. 2B, 3B, 4B, 5B, 6B, 7B, 8B, and 9B are plan views of current sensor packages deployed to sense current flowing a conductor wire (e.g., sensor packages 260, 360, 460, 560, 660, 760, 860 and 960). The current sensor packages can be deployed to sense current flowing through a conductor (e.g., a wire) of a host circuit (e.g., an electronic circuit for an inverter, power distribution, starter-generator, servo-regulator, line connected power supply, solar energy power supply, uninterruptible power supply (UPS), robotics, etc.).

Each of the current sensor packages shown in FIGS. 2A through 9A (e.g., sensor packages 260, 360, 460, 560, 660, 760, 860 and 960) is a pass through package with an opening or hole (e.g., hole 161, FIG. 1) extending from one side of the package to an opposite side of the package. Current sensing elements (e.g., of a Hall effect current sensor, a Rogowski current sensor, etc.) are disposed in the sensor package around the hole or opening. Each of the current sensor packages may be deployed so that the current-carrying conductor (current flowing through which is to be sensed) passes through the opening or hole (e.g., hole 161, FIG. 1) from one side of the package to the opposite side of the package.

In each of the sensor package deployments shown in FIGS. 2A through 9A, the host circuit may include a printed circuit board (e.g., a two-sided circuit board 150 (FIGS. 2A through 8B), or a one-sided circuit board 950 (FIGS. 9A and 9B)).

In the sensor package deployments (of sensor packages 260, 360, 460, 560, 660, 760, 860) shown in FIGS. 2A through 8B, the conductor (e.g., wire 120) in which current flow is to be sensed may, for example, have one end affixed at a terminal 153 on a first side of two-sided circuit board 150. Wire 120 may extend from terminal 153 through an opening or hole 151 in the circuit board to the other side (second side) of the circuit board. Terminal 153 may be formed, for example, by solder material disposed on contact pads 152 on the first side of board. Hole 151 may be filled with insulating material (e.g., an epoxy, a rubber and/or plastic grommet, etc.). Wire 120 may be, or may include, an insulated electrical wire with an insulating wire jacket or cover 121 made of insulating materials such as plastic, rubber-like polymers, and/or varnish.

Figure 2A:
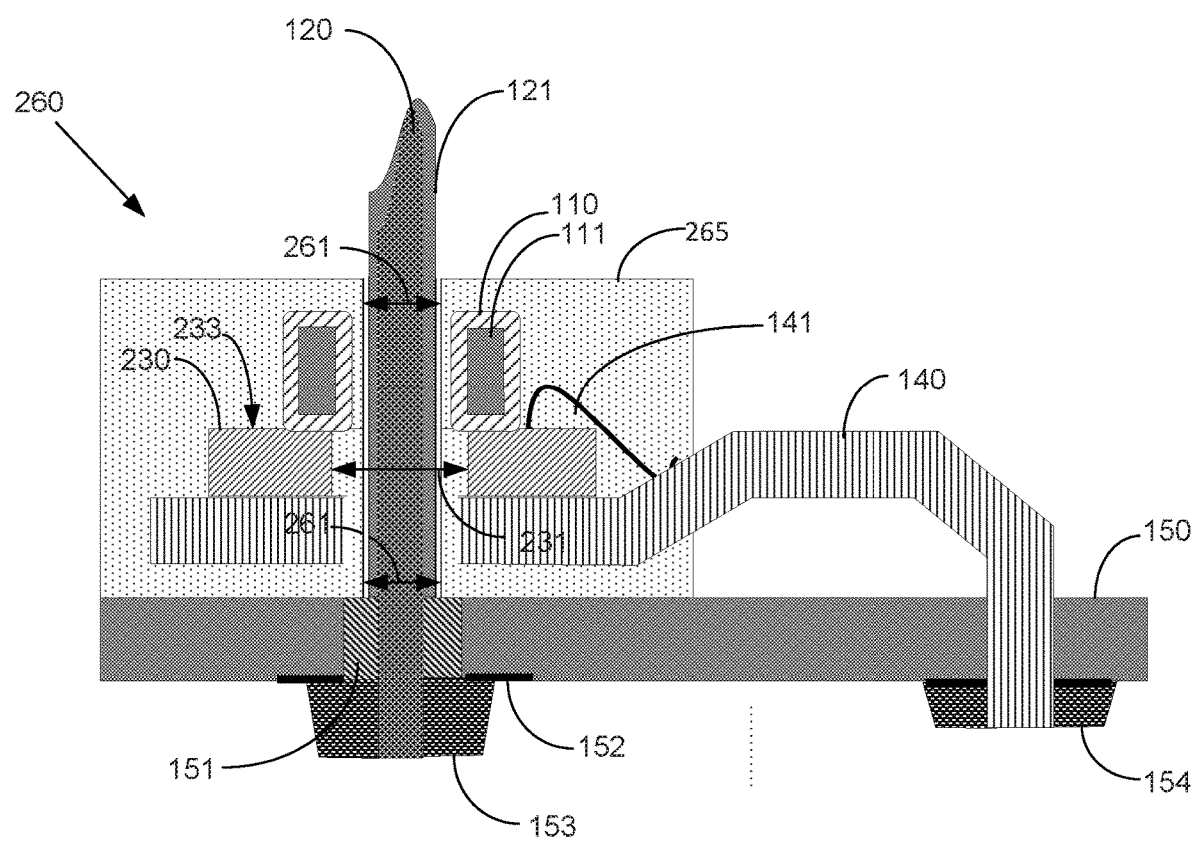
FIGS. 2A, 3A, 4A, 5A, 6A, 7A, 8A, and 9A are cross sectional views of current sensor packages deployed to sense current flow in a conductor wire.
Figure 2B:
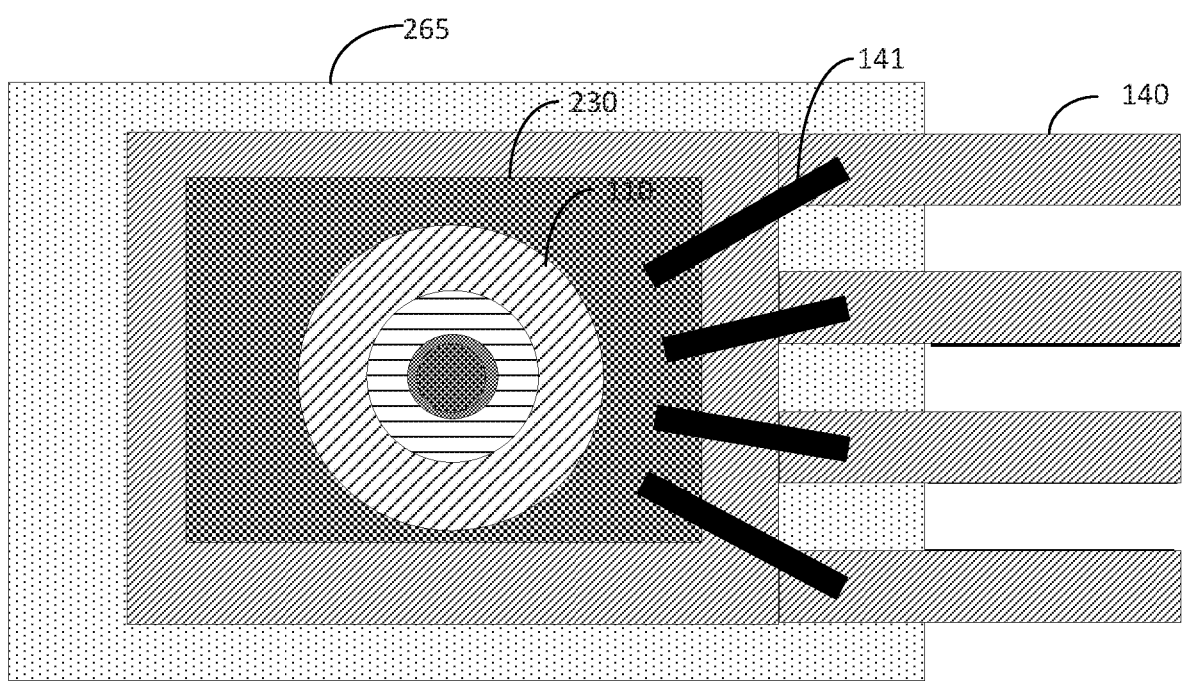
FIGS. 2B, 3B, 4B, 5B, 6B, 7B, 8B, and 9B are plan views of current sensor packages deployed to sense current flow in a conductor wire.

FIGS. 2A and 2B show an example deployment of a current sensor package 260 on circuit board 150 to sense current flow in wire 120. Sensor package 260 may, for example, be a chip package (e.g., a TO-220 package) including a semiconductor die 230 with lead frames (e.g., lead frame 140) that can carry signals from the die to the outside. In sensor package 260, a mold compound (e.g., epoxy 265) may cover or coat exposed surfaces semiconductor die 230. Sensor package 260 may be mounted on one side of circuit board 150 with lead frame 140 connected to one or more terminals such as terminal 154 (which may be formed by solder and/or other conductive material) on the outside of circuit board 150.

In example implementations, current sensor package 260 may include a Hall effect current-sensor semiconductor die 230 to which magnetic field concentrator coils 110 are attached. Magnetic field concentrator coils 110 may optionally include a ferrite core 111.

Semiconductor die 230 (and coils 110) may include an opening or hole 231 extending from one side of the semiconductor die to the opposite side of the semiconductor die. Opening 131 may be aligned (e.g., coaxially aligned) with opening 261 in sensor package to accommodate wire 120. Wire 120 may extend from terminal 153 on circuit board 150 to the outside of sensor package 260 (e.g., toward portions of the host circuit (not shown)) through opening 231 in the semiconductor die and opening 261 in sensor package 160. In example implementations, wire 120 is galvanically isolated from sensor package 260 by insulating materials (including, for example, epoxy mold compound used in packaging and/or insulating wire jacket 121) disposed in openings 231, 151 and 261. In some instances, some segments of wire 120 may be galvanically isolated from sensor package 260 by air spacing or gaps between wire 120 and the surfaces of sensor package 260 in openings 231, 151 and 261.

Hall effect current-sensor semiconductor die 230 may include active and passive integrated circuit elements (not shown) for sensing and processing Hall effect voltage signals in the semiconductor die that are responsive to current flow in wire 120.

Magnetic field concentrator coils 110 may focus magnetic flux lines (which are generated by current flow in wire 120) for measurement by the sensing elements of the semiconductor die. Focusing the magnetic flux lines may serve to enhance the device's sensitivity.

One or more bonded wire connections such as bonded wire connection 141 (which may be bonded to contact pads (not shown) on semiconductor die 230) may carry signals from semiconductor die 230 to the outside via lead frame 140.

Lead frame 140 may extend from inside of sensor package 260 to a free end for mounting on circuit board 150. The free end of lead frame 140 may, for example, be attached to circuit board 150 at terminal 154 formed, for example, by solder material or other conductive adhesive material. In example sensor package deployments, lead frame 140 extending from inside of the sensor package may be geometrically bent for attachment to circuit board so that the sensor package has an orientation (e.g., generally parallel to circuit board 150) in which the sensor package openings (e.g., openings 231 and 261) are axially aligned (e.g., generally perpendicular to circuit board 150) with wire 120. In an alternate sensor package deployment configuration, lead frame 140 may not be geometrically bent and may extend perpendicularly from the circuit board 150. In this alternate sensor package deployment configuration, wire 120, nonetheless, passes through sensor package opening 261 (which may be aligned generally parallel to circuit board 150).

In some implementations, as shown in FIG. 2A, coils 110 may be attached to, or fabricated on, a surface 233 of semiconductor die 230.

In some implementations, (as shown, e.g., in FIG. 3A, FIG. 6A and FIG. 9A) coils 110 may be inserted (partially or fully) and soldered into a cutout in the die using, for example, a pick and place tool. Fabricating or inserting coils 110 in the die as shown in may facilitate interconnects between coils 110 and the top surface of the die and may result in a lower package height.

Figure 3A:
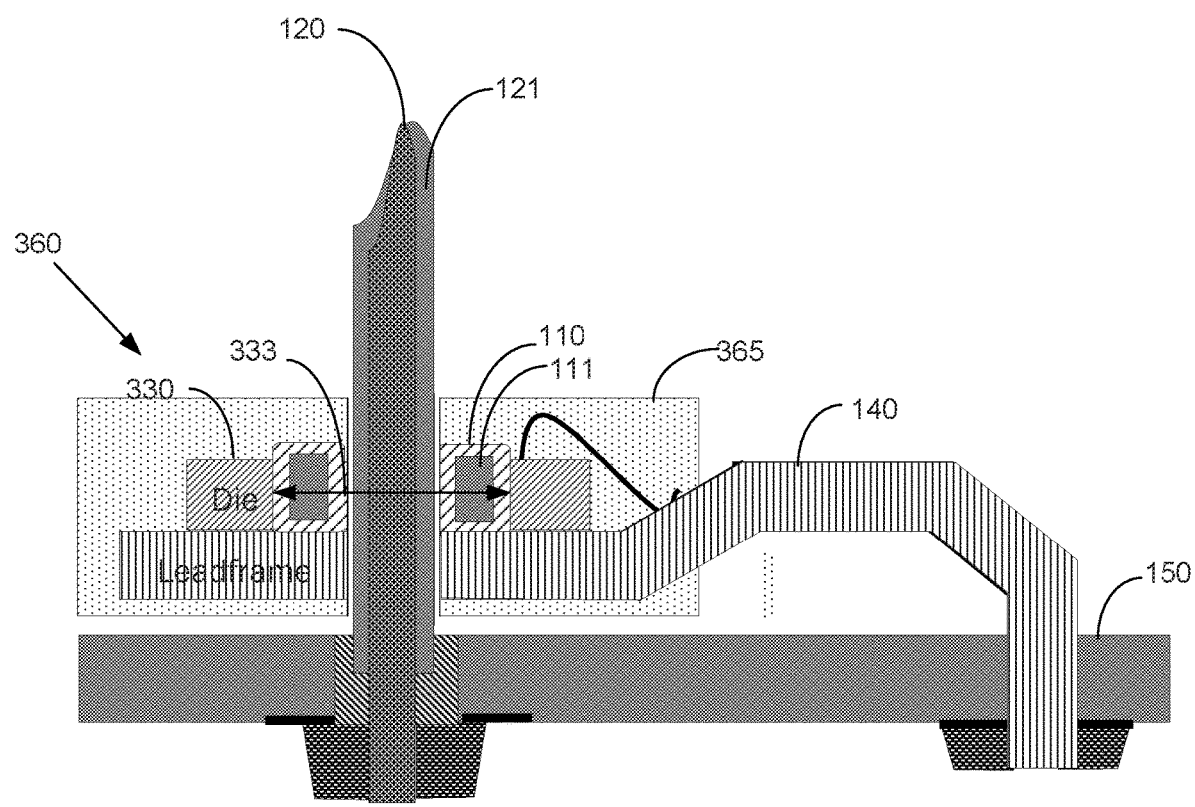
Figure 3B:
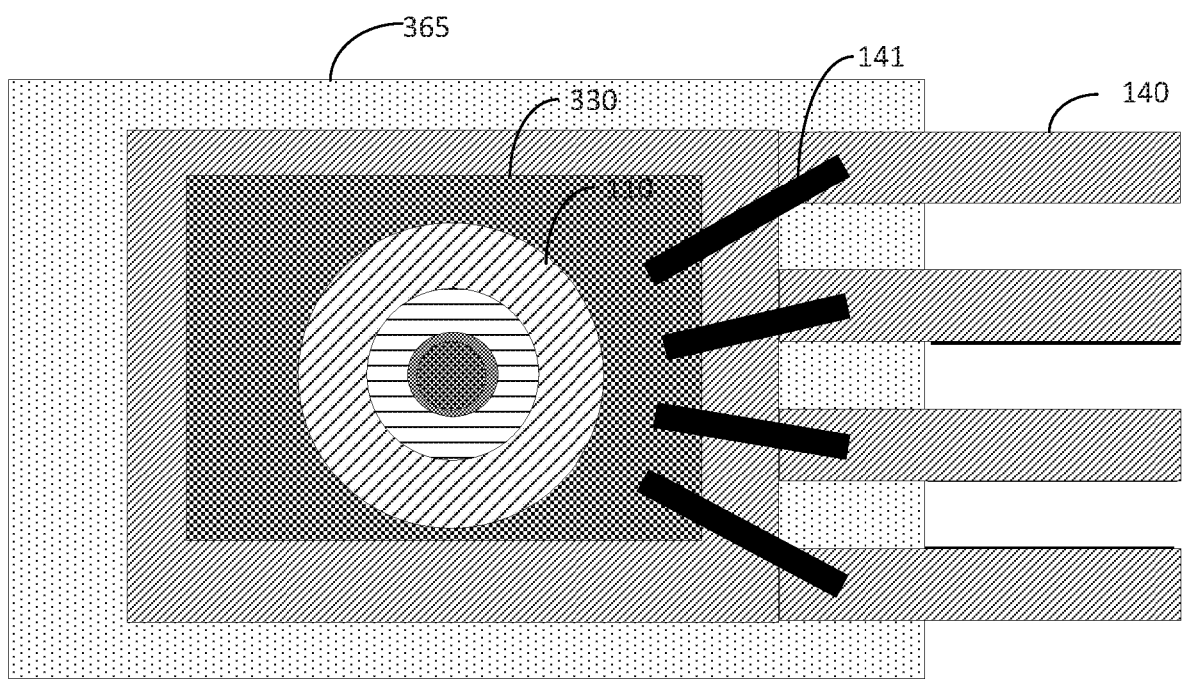

FIGS. 3A and 3B show an example current sensor package 360 including a Hall effect current-sensor semiconductor die 330 in which magnetic field transducer or concentrator coils 110 are inserted in a cutout 333 in the die. Sensor package 360, like sensor package 260, may, for example, be a TO-220 package with lead frames (e.g., lead frame 140) that can carry signals from the die to the outside. In sensor package 360, a mold compound (e.g., epoxy 365) may cover or coat exposed surfaces semiconductor die 330. A vertical height (in a direction generally perpendicular to circuit board 150) of current sensor package 360 with coils 110 inserted cutout 333 in semiconductor die 330 is seen (FIG. 3A) to be smaller than the vertical height of current sensor package 260 with coils 110 attached to surface 233 semiconductor die 230 (FIG. 2A).

Figure 4A:
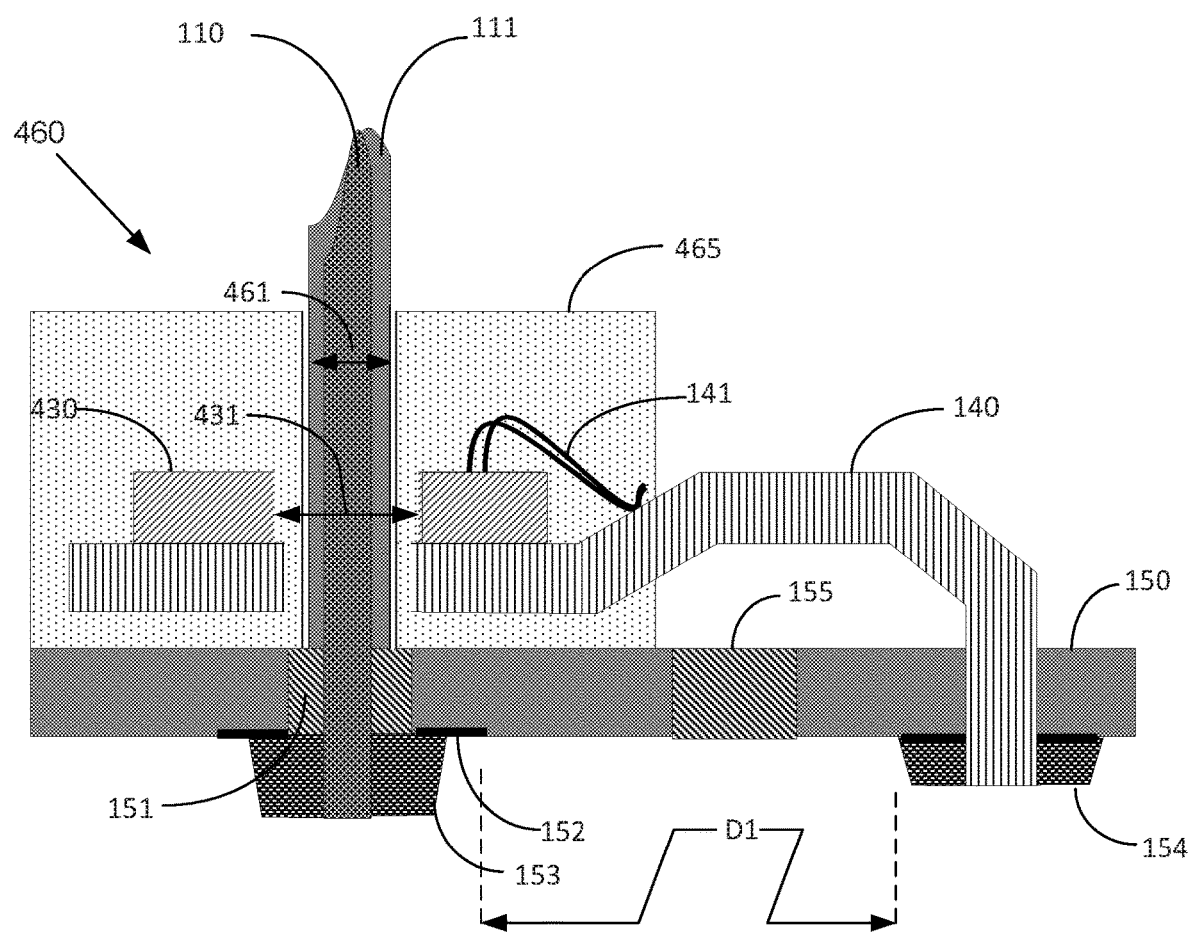
Figure 4B:
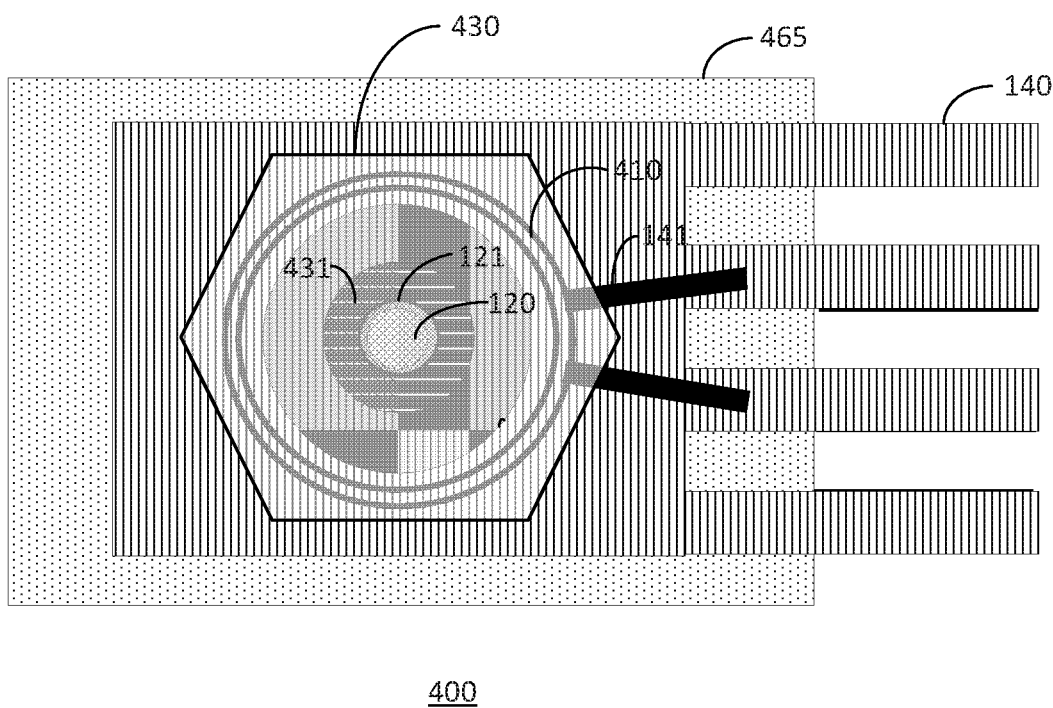

FIGS. 4A and 4B show an example deployment of another current sensor package 460 on circuit board 150 to sense current flowing in wire 120. Current sensor package 460 may include a Rogowski-type sensor with Rogowski coils 410 formed on, or in, a semiconductor die 430 (FIG. 4B).

Semiconductor die 430 includes an opening or hole 431 extending from one side of the semiconductor die to the opposite side of the semiconductor die. In sensor package 460, a mold compound (e.g., epoxy 465) may cover or coat exposed surfaces semiconductor die 430.

Sensor package 460, like sensor packages 260 and 360, may, for example, be a TO-220 package with lead frames (e.g., lead frame 140) that can carry signals from the die to the outside. Semiconductor die 430 may include active and passive integrated circuit elements (not shown) for sensing and processing Rogowski coil signals in the semiconductor die that are responsive to current flow in wire 120. Bonded wire connection 141 (which may be bonded to contact pads (not shown) on semiconductor die 430) may carry signals from semiconductor die 430 to the outside via lead frame 140. Like sensor package 260 (FIG. 2A), sensor package 460 may be mounted on one side of circuit board 150 with lead frame 140 connected to a terminal 154 on the outside of circuit board 150. Opening 431 may be aligned (e.g., coaxially aligned) with opening 461 in the sensor package to accommodate wire 120. Wire 120 is galvanically isolated from sensor package 460 by insulating materials (including, for example, insulating wire jacket 121) disposed in openings 431, 151 and 461.

In addition to the galvanic isolation provided by insulating materials between wire 120 and sensor package components, high voltage hazard in the sensor package deployments may be reduced, for example, by increasing a creepage distance between conductive elements over the insulating surface of circuit board 150. As shown for example in FIG. 4A, the creepage distance D1 between terminal 153 and terminal 154 may be increased by introducing a gap, a slot, and/or a cut 155 in circuit board 150 between terminal 153 and terminal 154.

In example implementations, as shown in FIG. 4B, semiconductor die 430 may have a hexagonal shape cross section (e.g., in a plane parallel to a major surface of the die), which may be conducive to alignment of components (including, e.g., another die (not shown)) when assembling sensor package 460. Since hexagonal close packing is mathematically the most efficient packing shape, use of hexagonal-shape semiconductor die 430 can maximize the number of die that are obtained per wafer (e.g., when fabricating circuits having a generally "round" shape such as the circular inductive coils printed in the die).

Figure 5A:
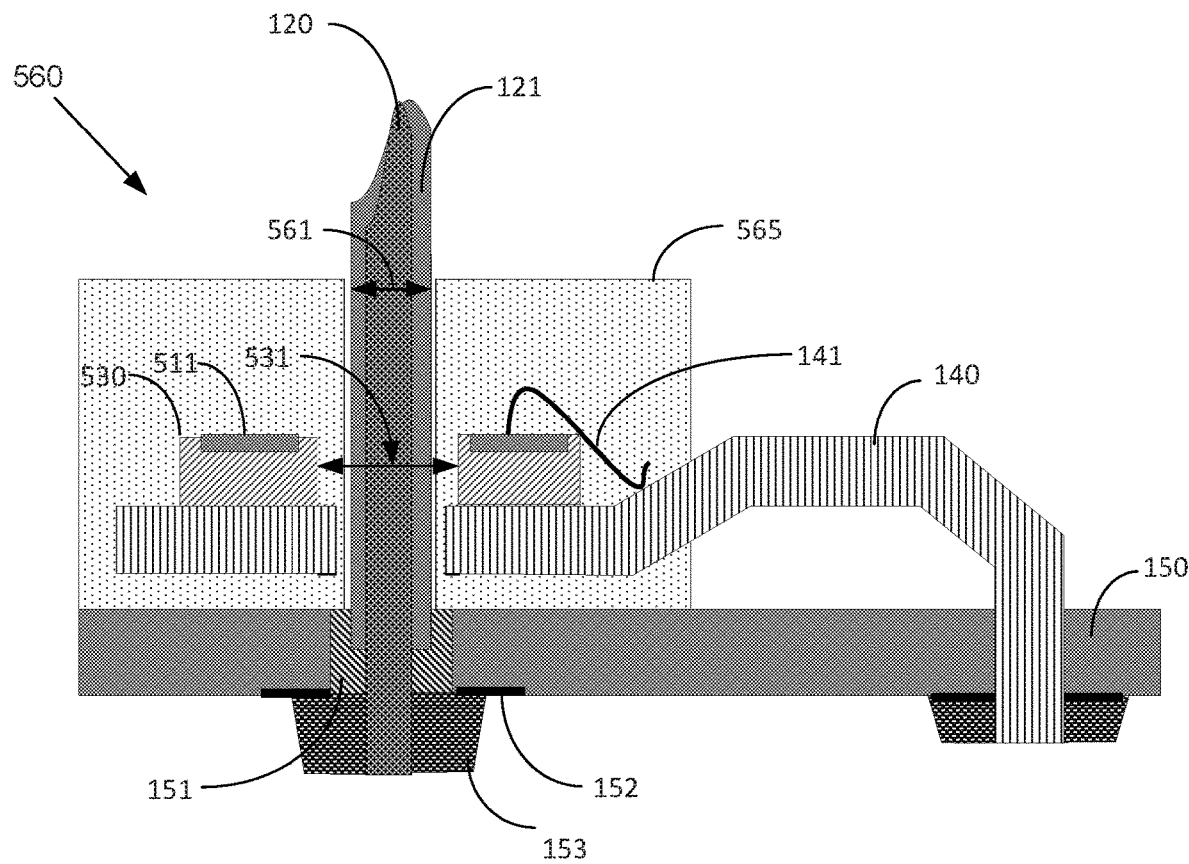
Figure 5B:
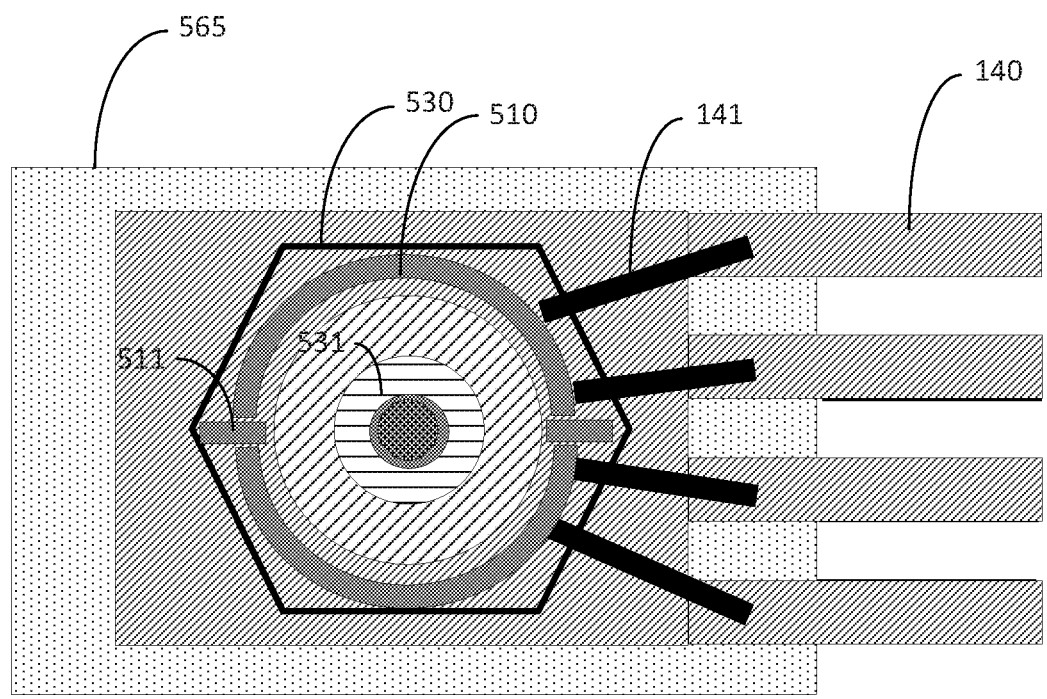

FIGS. 5A and 5B show an example deployment of another current sensor package 560 on circuit board 150 to sense current flowing in wire 120. Current sensor package 560 may include a vertical Hall effect current sensor 511 (with a vertical orientation of Hall plates) in combination with Rogowski coils 510 formed on, or in, a semiconductor die 530. Vertical Hall effect current sensor 511 may, for example, integrate active and passive integrated circuit elements (e.g., a Hall effect voltage generator, a small-signal amplifier, chopper stabilization, a Schmitt trigger, and one or more NMOS outputs, etc.) on semiconductor die 530. The combination of the vertical Hall sensor and the Rogowski coils may allow current sensor package 560 to be used to concurrently sense both AC and DC current flows through wire 120.

Like semiconductor dies 230, 330 and 430, semiconductor die 530 may include an opening or hole 531 extending from one side of the semiconductor die to the opposite side of the semiconductor die and aligned with opening 561 in semiconductor package 560 to accommodate wire 120 there through.

Sensor package 560, like sensor packages 260, 360 and 460, may, for example, be a TO-220 package with lead frames (e.g., lead frame 140) that can carry signals from the die to the outside. Semiconductor die 530 may include active and passive integrated circuit elements for sensing and processing the vertical sensor (Hall effect) and Rogowski coil signals in the semiconductor die that are responsive to current flow in wire 120. In sensor package 560, a mold compound (e.g., epoxy 565) may cover or coat exposed surfaces semiconductor die 530.

Bonded wire connection 141 (which may be bonded to contact pads (not shown) on semiconductor die 530) may carry signals from semiconductor die 530 to the outside via lead frame 140. Like sensor packages 260, 360 and 460, sensor package 560 may be mounted on one side of circuit board 150 with lead frame 140 connected to a terminal 154 on the outside of circuit board 150.

In some implementations, a current sensor may be assembled in a wafer level chip scale package (WLCSP) or an optical device chip scale package (ODCSP) using, for example, solder bumps, solder interconnects, or a solderable surface.

Figure 6A:
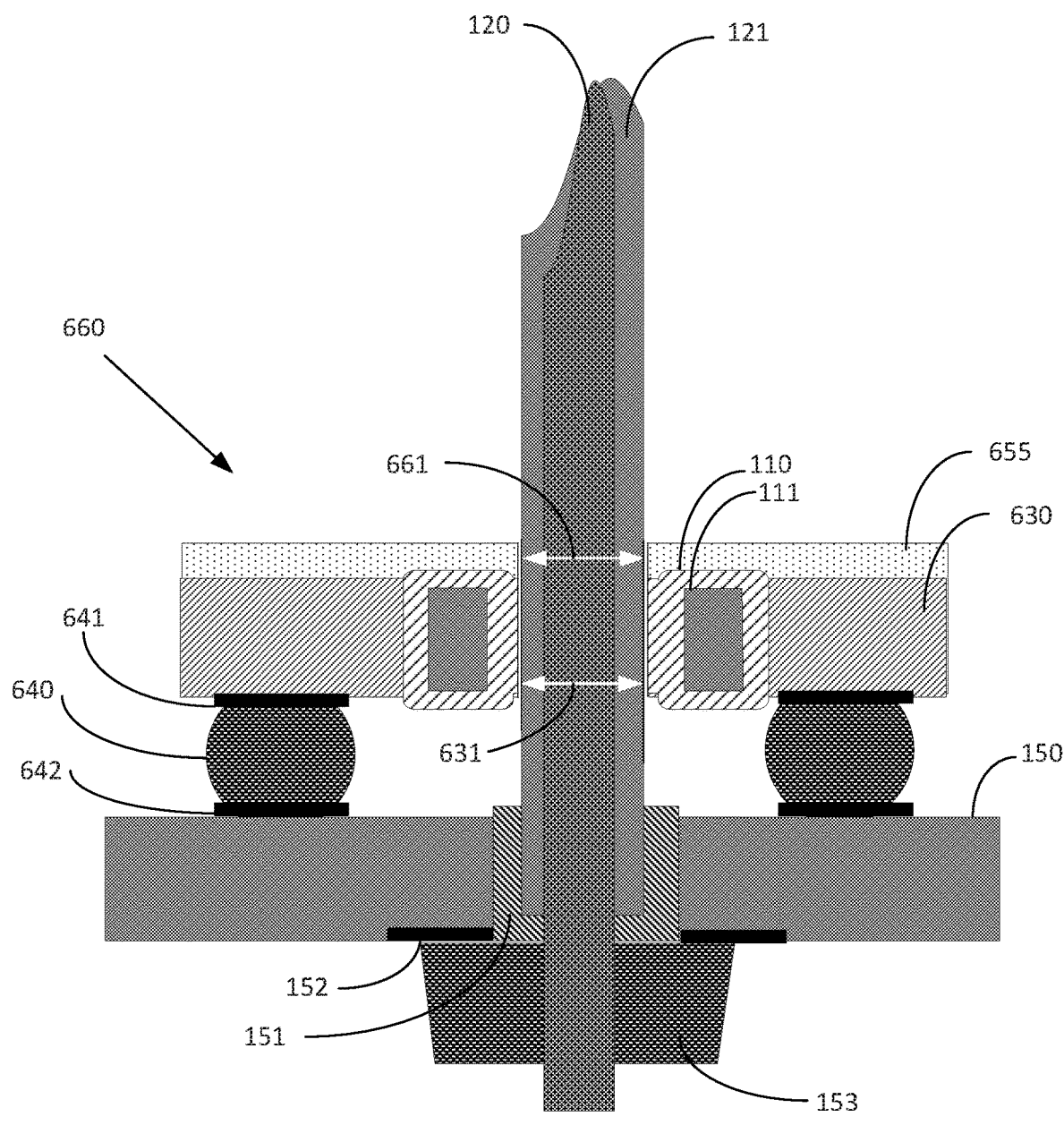
Figure 6B:
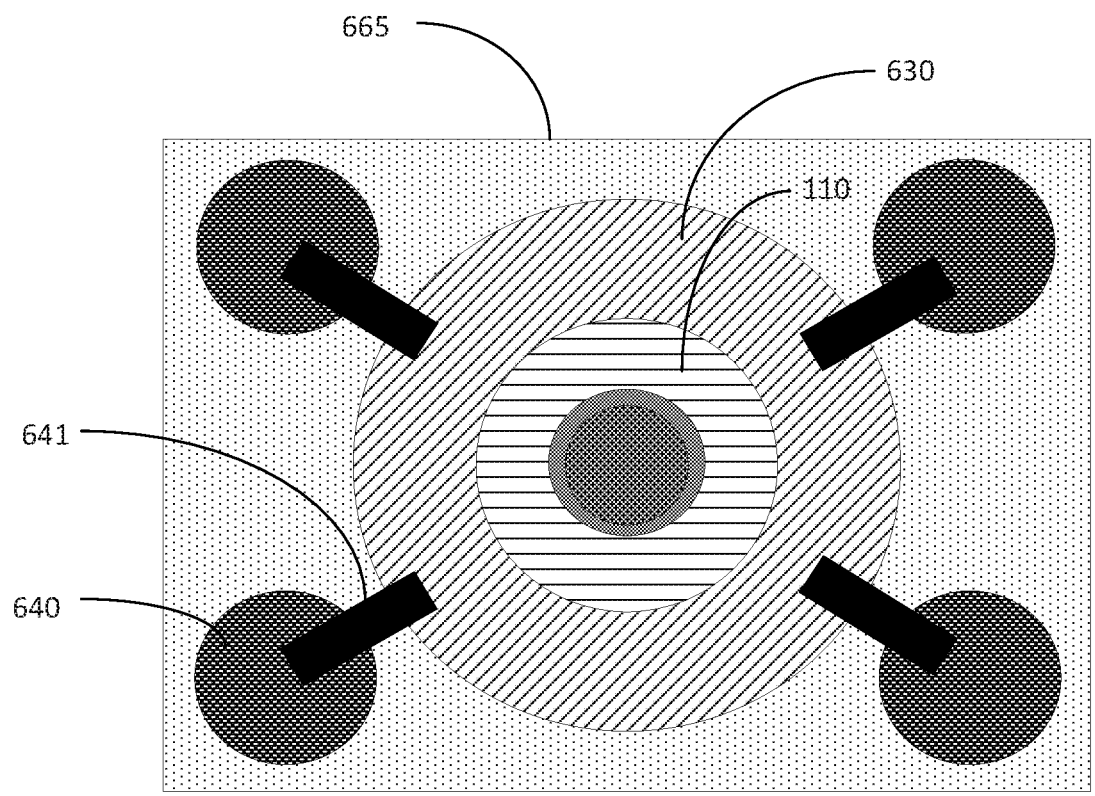

FIGS. 6A and 6B show an example deployment of a wafer level chip scale package (WLCSP) (e.g., sensor package 660) on circuit board 150 to sense current flowing in wire 120. Sensor package 660 may include a Hall effect sensor semiconductor die 630 with magnetic field transducer or concentrator coils 110 (optionally including ferrite core 111) inserted in a cutout in semiconductor die 630. Coils 110 (e.g., copper coils) may be soldered into the die using a pick/place tool prior to when backside protective coatings are attached. A surface of semiconductor die 630 and coils 110 may be coated with a backside coating material (e.g., epoxy coating layer 665). In example implementations, coils 110 may be fabricated in situ in, or on, the die.

Semiconductor die 630 (and coils 110) may include an opening or pass through hole 631 extending from one side of the semiconductor die to the opposite side of the semiconductor die. Hole 631 may be aligned with hole 661 in sensor package 660 that extends from one side of the sensor package to the opposite side of the sensor package to accommodate wire 120 there through.

Semiconductor die 630 (like the other semiconductor dies 230-530) may include active and passive integrated circuit elements (not shown) for sensing and processing Hall effect voltage signals in the semiconductor die that are responsive to current flow in wire 120. Solder bumps 640 (which may be bonded or soldered to contact pads 641 on die 430 and contact pads 642 on circuit board 150) may carry signals from semiconductor die 630 (and coil 110) to the outside. In some implementations, semiconductor die 630 may include through-silicon-vias (TSVs) (not shown) that may assist in the routing of the electrical circuits and interconnections, for example, between the top and bottom sides of semiconductor die 630.

Figure 7A:
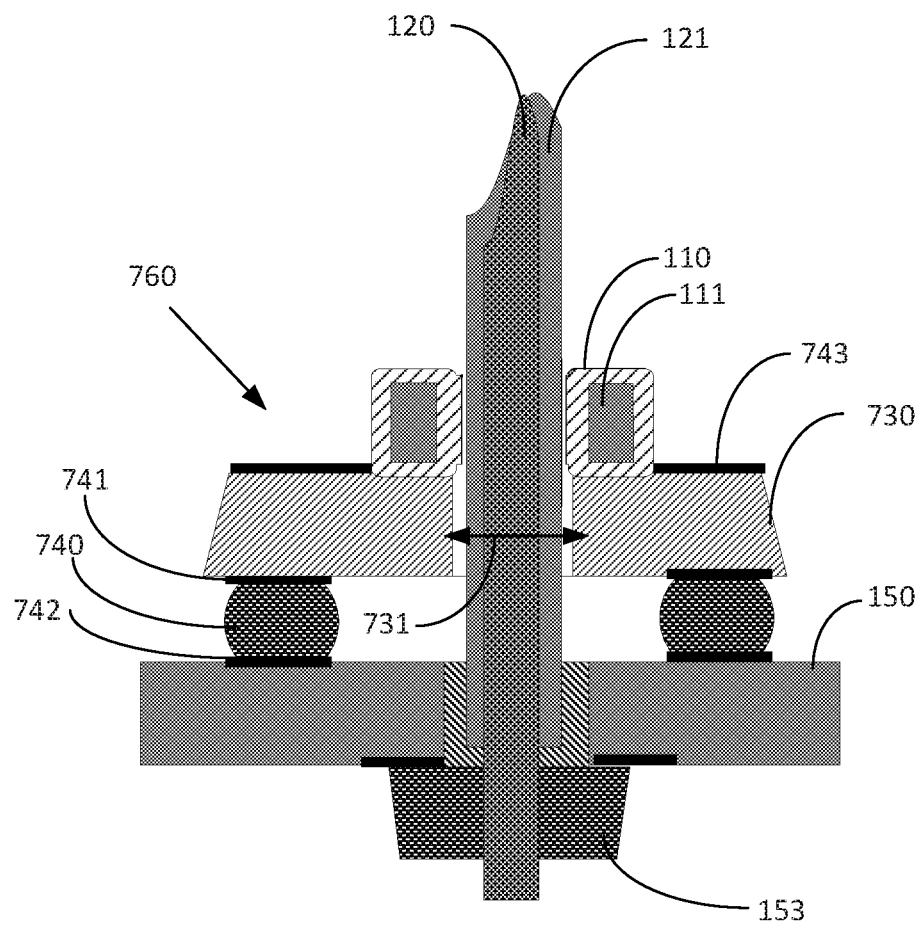
Figure 7B:
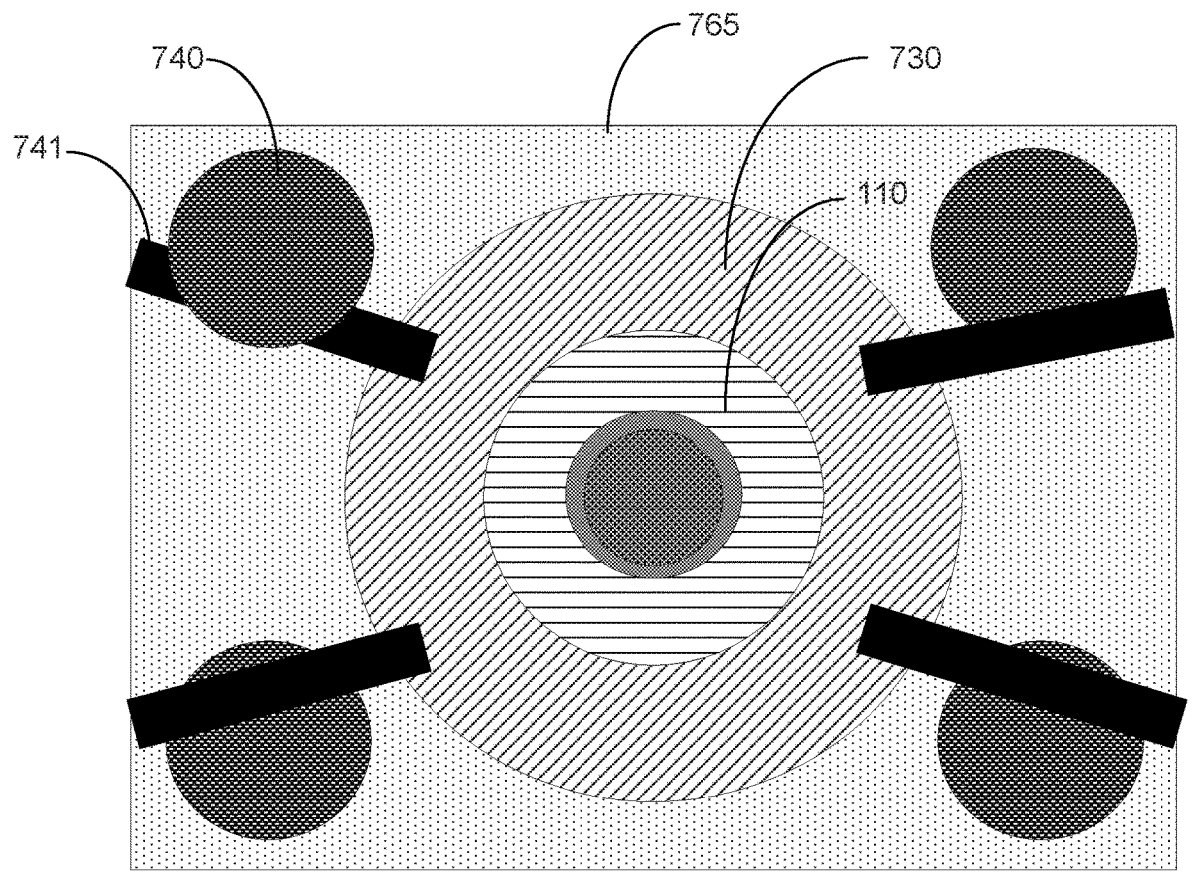

FIGS. 7A and 7B show an example deployment of a modified optical device chip scale package (ODCSP) (e.g., sensor package 760) on circuit board 150 to sense current flowing in wire 120. This package is an example of a semiconductor die which has electrically conductive paths (not shown) on the sides of the semiconductor die 730 which connect the top and bottom major surfaces, or contact pads 741 to 743. Sensor package 760 may include a Hall effect current-sensor semiconductor die 730 to which magnetic field transducer or concentrator coils 110 (optionally including ferrite core 111) may be soldered on contact pads 743. Coils 110 may be soldered on contact pads 743 using a pick/place tool either before or after mounting current sensor package 760 on circuit board 150. In sensor package 760, a mold compound (e.g., epoxy 765) may cover or coat exposed surfaces semiconductor die 730.

Semiconductor die 730 (and coils 110) may include a pass through opening or hole 731 extending from one side of the semiconductor die to the opposite side of the semiconductor die to accommodate wire 120.

Semiconductor die 730 (like the other semiconductor dies 230-630) may include active and passive integrated circuit elements (not shown) for sensing and processing Hall effect voltage signals in the semiconductor die that are responsive to current flow in wire 120. Solder bumps 740 (which may be bonded or soldered to contact pads 741 on die 730 and contact pads 742 on circuit board 150) may carry signals from semiconductor die 730 (and coil 110) to the outside.

Figure 8A:
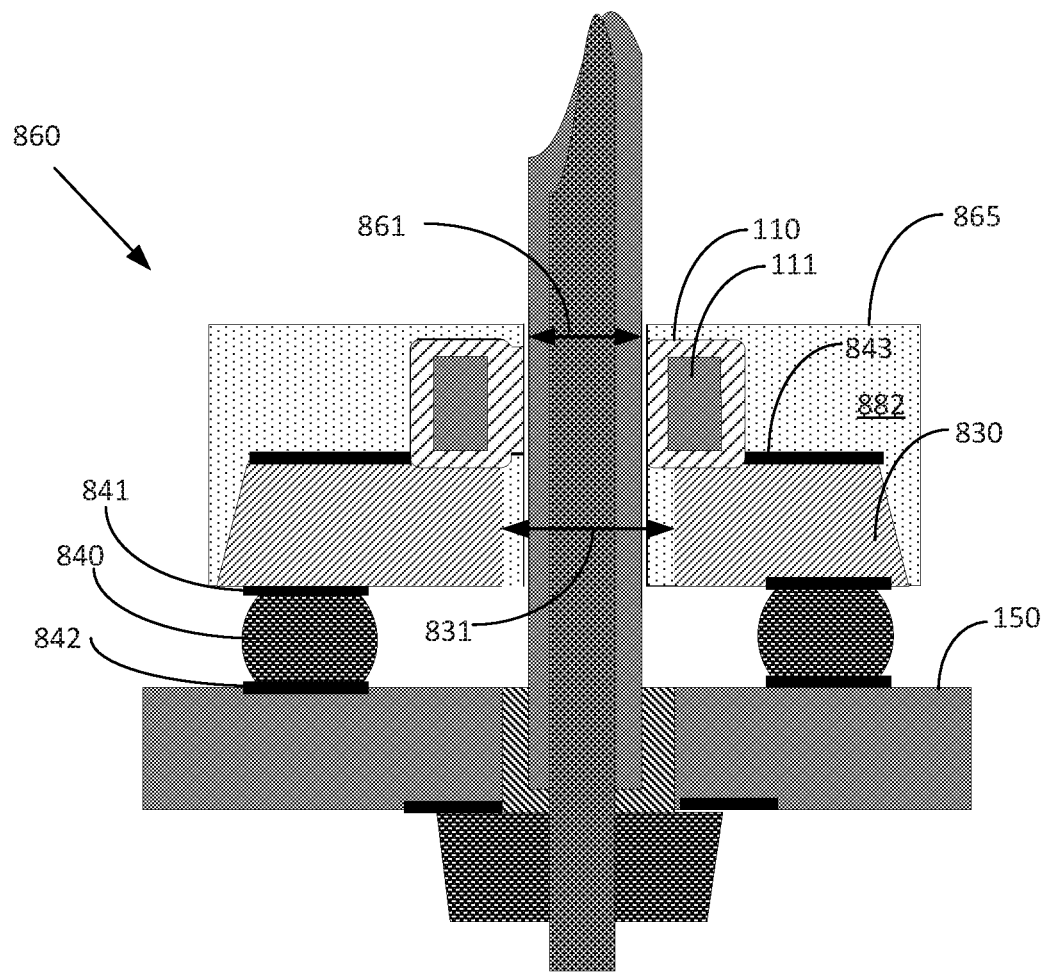
Figure 8B:
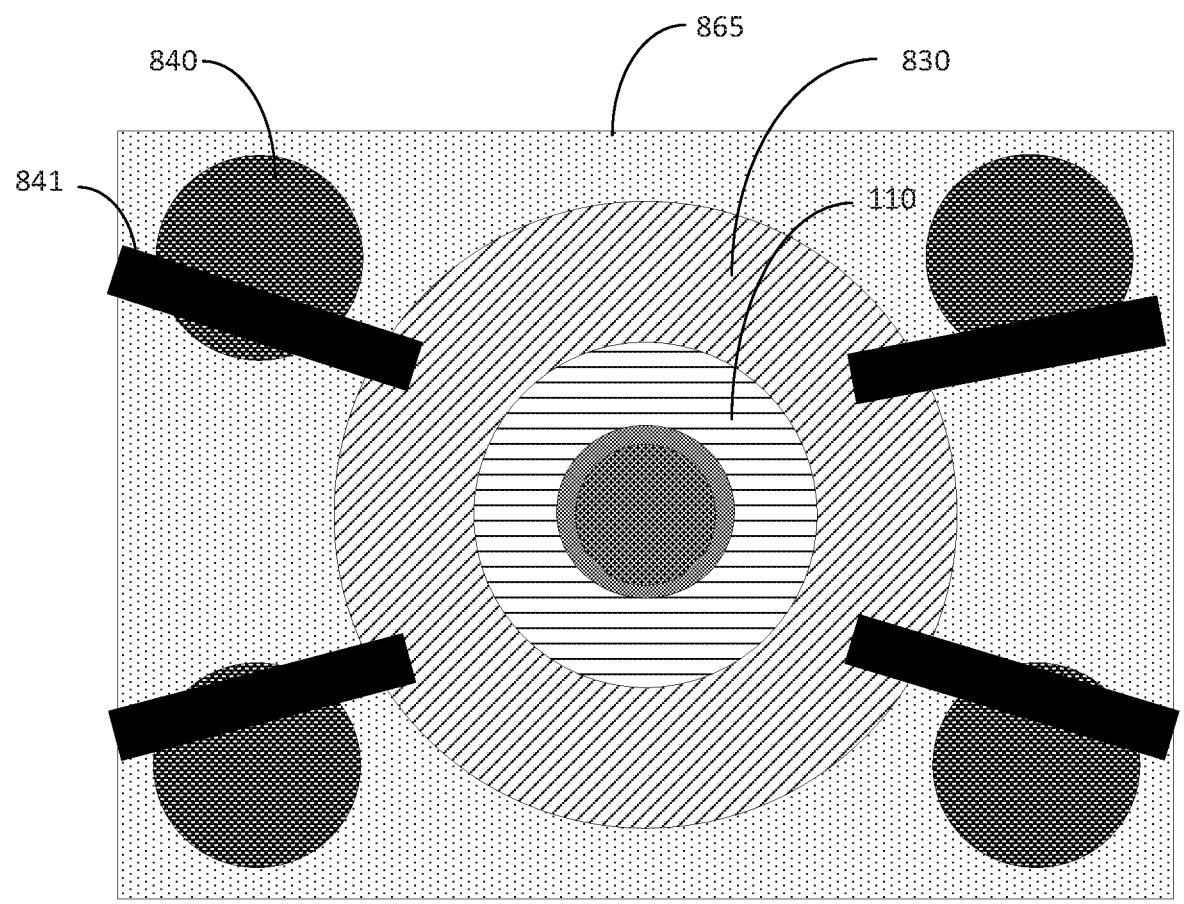

FIGS. 8A and 8B show an example deployment of a modified molded optical device chip scale package (OD-CSP) (e.g., sensor package 860) on circuit board 150 to sense current flow in wire 120. Sensor package 860 may include a Hall effect current-sensor semiconductor die 830 packaged in a molding 865. Magnetic field transducer or concentrator coils 110 (optionally including ferrite core 111) may be soldered on contact pads 843 on semiconductor die 830 using a pick/place tool either before or after mounting current sensor package 860 on circuit board 150. A surface of semiconductor die 830 and coils 110 may be coated with a backside coating material (e.g., epoxy coating layer 865).

Semiconductor die 830 (and coils 110) may include a pass through opening or hole 831 extending from one side of the semiconductor die to the opposite side of the semiconductor die to accommodate wire 120. Hole 831 may be aligned with hole 861 in sensor package 860 that extends from one side of the sensor package to the opposite side of the sensor package to accommodate wire 120 there through.

Semiconductor die 830 (like the other semiconductor dies 230-730) may include active and passive integrated circuit elements (not shown) for sensing and processing Hall effect voltage signals in the semiconductor die that are responsive to current flow in wire 120. Solder bumps 840 (which may be bonded or soldered to contact pads 841 on die 830 and contact pads 842 on circuit board 150) may carry signals from semiconductor die 830 (and coils 110) to the outside. Electrical contacts on the edges of semiconductor die 830 are used to connect the electrical pads 841 to 843.

In the various deployments of sensor packages (e.g., sensor packages 260, 360, 460, 560, 660, 760, and 860) described above (with reference to, for example, FIGS. 2A through 8A and FIGS. 2B through 8B), a free end of wire 120 may be inserted or passed through the opening (e.g., opening 231) in the semiconductor die (e.g., after the sensor package is placed on circuit board 150, which is a two-sided circuit board) and passed through opening 151 from one side of the circuit board to the other side of the circuit board before being soldered to form terminal 153 on circuit board 150.

Figure 9A:
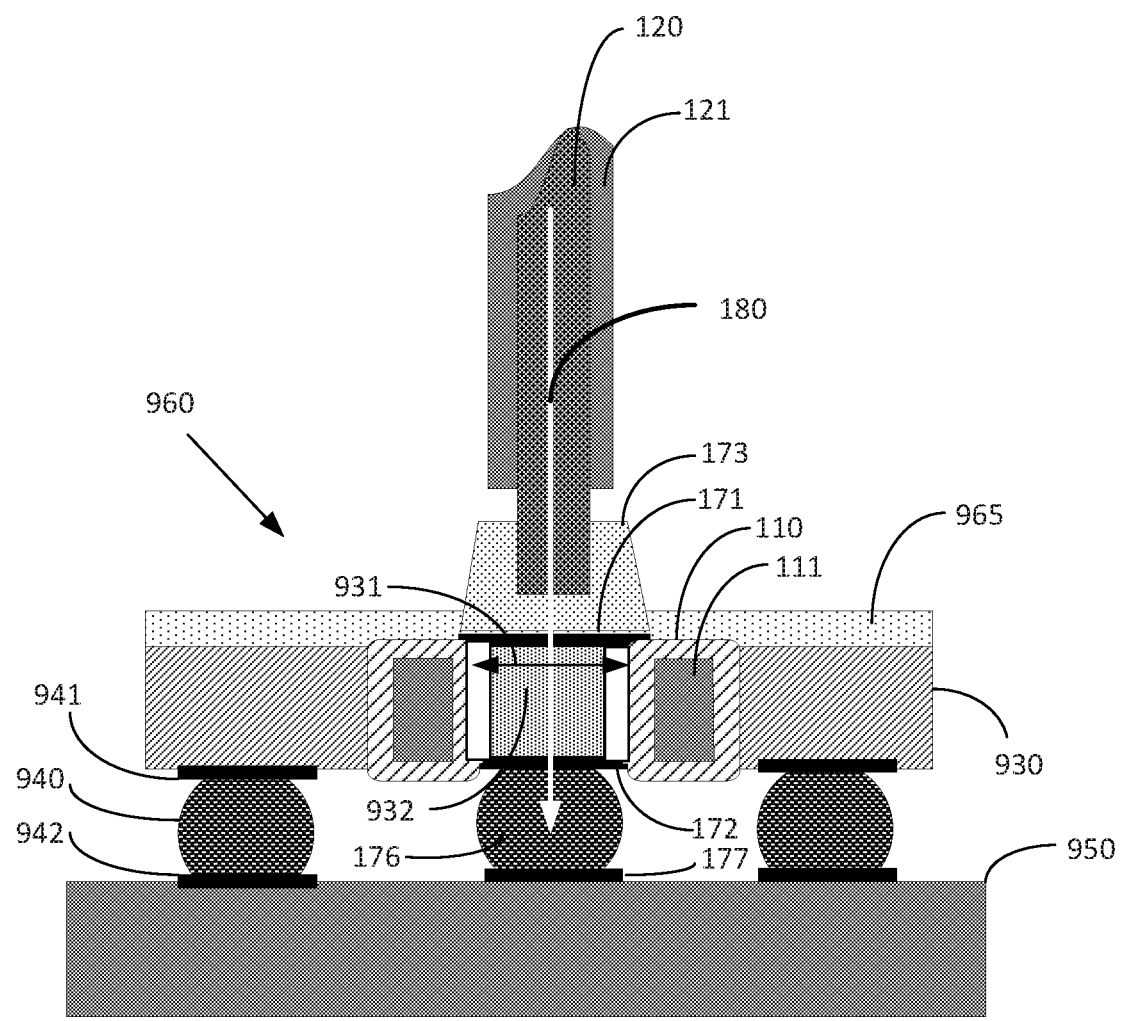
Figure 9B:
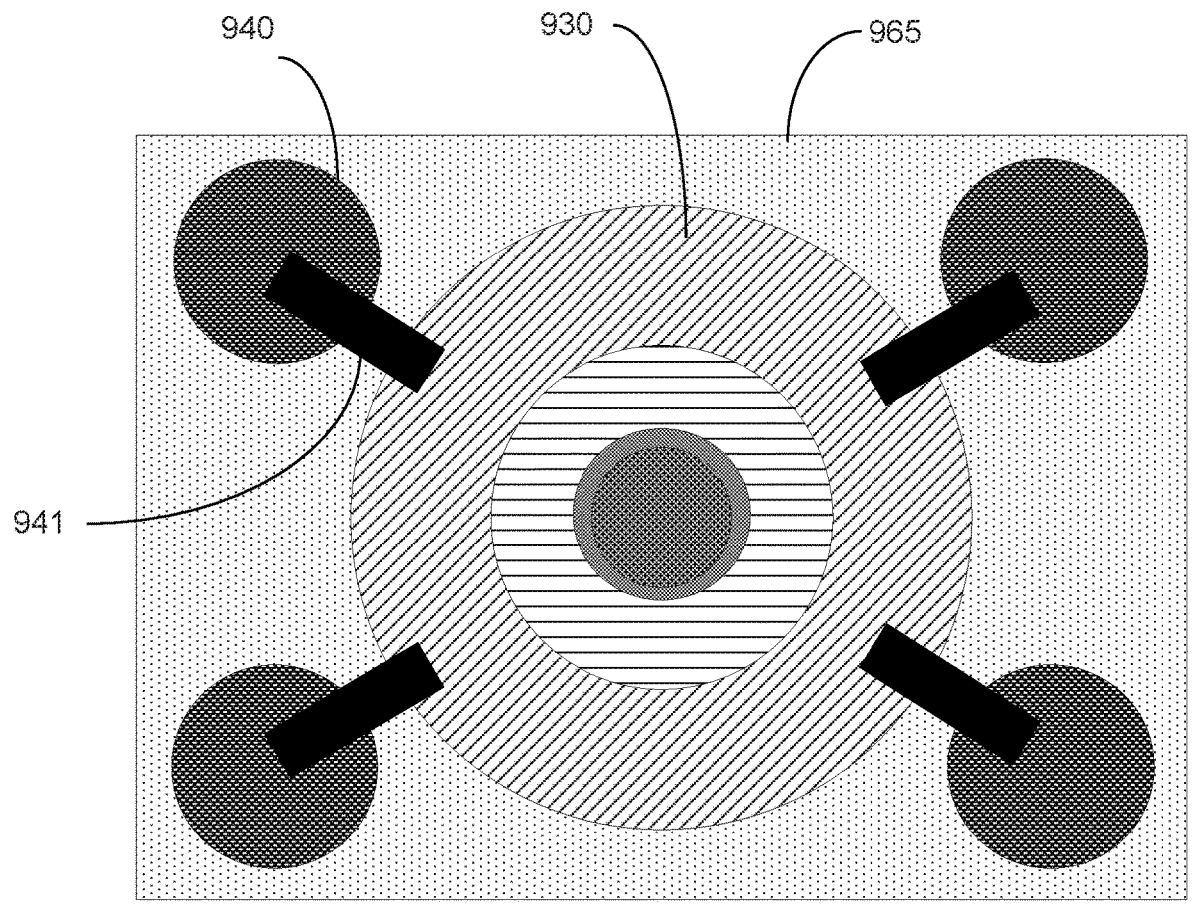

FIG. 9A and FIG. 9B show an example deployment of a Wafer Level Chip Scaled Package (WLCSP) (e.g., current sensor package 960) on single sided circuit board 950 to sense current flow in wire 120. Current sensor package 960 may include a Hall effect current-sensor semiconductor die 930 that includes magnetic field transducer or concentrator coils 110 (optionally including ferrite core 111). A surface of semiconductor die 930 and coils 110 may be coated with a backside coating material (e.g., epoxy coating layer 965).

Opening 931 in semiconductor die 930 (and coil 110) may include conductive material (e.g., solder) 932 bounded by an upper contact pad 171 and a lower contact pad 172. Wire 120 may be attached to upper contact pad 171 using solder material (e.g., interconnect 173), for example, by a customer. A current path (e.g., current path 180) through wire 120 (and through the conductive material in opening 931) across semiconductor die 930/sensor package 960 may be completed by a solder bump connection 176 between lower contact pad 172 and a contact pad 177 on circuit board 950. In some implementations, semiconductor die 930 may include through-silicon-vias (TSVs) (not shown) that may assist in the routing of the electrical circuits and interconnections, for example, between the top and bottom sides of semiconductor die 930.

Semiconductor die 930 (like the other semiconductor dies 260-860) may include active and passive integrated circuit elements (not shown) for sensing and processing Hall effect voltage signals in the semiconductor die that are responsive to current flow in wire 120. Solder bumps 940 (which may be bonded or soldered to contact pads 941 on die 730 and contact pads 942 on circuit board 950) may carry signals from semiconductor die 930 (and coils 110) to the outside.

FIG. 10 shows an example method 1000 for sensing current flow in a conductor wire. Method 1000 includes coupling a current sensor to a semiconductor die (1010). The current sensor may be, fully or partially, disposed in and/or on the semiconductor die. The semiconductor die has a pass through hole extending from one side of the semiconductor die to an opposite side of the semiconductor die. Method 1000 further includes disposing the semiconductor die about the conductor wire, for example, by passing the conductor wire passing through the hole in the semiconductor die from the one side of the semiconductor die to the opposite side of the semiconductor die (1020), and detecting, by the current sensor in the semiconductor die, a signal proportional to current flow in the conductor wire passing through the hole in the semiconductor die (1030).

The semiconductor die can be packaged in a sensor package having a pass through hole extending from one side of the sensor package to an opposite side of the sensor package. In method 1000, disposing the semiconductor die about the conductor wire 1020 may include placing the sensor package about the conductor wire with the conductor wire passing through the hole in the sensor package from the one side of the sensor package to the opposite side of the sensor package.

Further, in method 1000, detecting the signal proportional to the current flow in the conductor wire passing through the hole in the semiconductor die (1030) includes detecting a Hall effect voltage in a sensor element (e.g., a Hall plate in the semiconductor die) and or detecting an induced voltage in a Rogowski coil.

Specific structural and functional details disclosed herein are merely representative for purposes of describing example embodiments. Example embodiments, however, be embodied in many alternate forms and should not be construed as limited to only the embodiments set forth herein. For example, in the embodiments described with reference to the figures herein, a pass through hole extending from one side of the semiconductor die to an opposite side of the semiconductor die is shown as passing through a center portion of the semiconductor die. However, in alternate forms of the embodiments, a pass through hole may pass through an off-center portion of the semiconductor die. Further, for example, in the embodiments described with reference to the figures herein, a pass through hole extending from one side of the semiconductor die to an opposite side of the semiconductor die is shown as having a generally circular cross section. However, in alternate forms of the embodiments, a pass through hole extending from one side of the semiconductor die to an opposite side of the semiconductor die can have a non-circular (e.g., an oval, a triangular, a square, a rectangular, a quadrilateral, a pentagonal, or a hexagonal shape, etc.) cross section. Further, for example, in the embodiments described with reference to the figures herein, the semiconductor die is shown as having a generally circular shape (except for FIG. 4B, which shows a semiconductor die having a hexagonal shape). However, in alternate forms of the embodiments, the semiconductor die can have a non-circular shape (e.g., an oval, a triangular, a square, a rectangular, a quadrilateral, a pentagonal, or a hexagonal shape, etc.). Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), and/or so forth.

The terminology used herein is for the purpose of describing particular implementations only and is not intended to be limiting of the implementations. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Example implementations of the present inventive concepts are described herein with reference to cross-sectional illustrations that are schematic illustrations of idealized implementations (and intermediate structures) of example implementations. As such, variations from the shapes of the illustrations as a result, for example, of manufacturing techniques and/or tolerances, are to be expected. Thus, example implementations of the present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example implementations.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present implementations.

Unless otherwise defined, all terms (including technical and scientific terms) used herein have the same meaning as commonly understood by one of ordinary skill in the art to which this present inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor die comprising:
   a semiconductor substrate of the semiconductor die;
   a through hole in the semiconductor substrate extending from one side of the die to an opposite side of the semiconductor die, the through hole configured to receive a current-carrying conductor there through; and
   at least one current sensor coupled to the semiconductor substrate and configured to sense current flow in the current-carrying conductor received in the through hole,
   the semiconductor die including contact pads configured to receive solder bumps configured to carry signals from the semiconductor die to outside of the semiconductor die.

2. The semiconductor die of claim 1, wherein the at least one current sensor includes an inductive sensor.

3. The semiconductor die of claim 1, wherein the at least one current sensor includes a Hall effect sensor.

4. The semiconductor die of claim 3, wherein the semiconductor die further includes a magnetic field concentrator coil disposed on a surface of the semiconductor die.

5. The semiconductor die of claim 3, wherein the semiconductor die further includes a magnetic field concentrator coil at least partially inserted in the semiconductor die.

6. The semiconductor die of claim 1, wherein the at least one current sensor includes one or more of an inductive sensor, a horizontal Hall effect sensor, and a vertical Hall effect sensor.

7. The semiconductor die of claim 6, wherein the one or more of an inductive sensor, a horizontal Hall effect sensor, and a vertical Hall effect sensor are configured to concurrently sense both AC and DC current flows through the current-carrying conductor received in the through hole.

8. The semiconductor die of claim 1, wherein the semiconductor die has a circular, an oval, a triangular, a quadrilateral, a pentagonal, or a hexagonal shape.

9. The semiconductor die of claim 1, wherein the current-carrying conductor received in the through hole is galvanically isolated from the semiconductor die.

10. A sensor package comprising:
a semiconductor die including at least one current sensor, the semiconductor die including a first pass through hole extending from one side of the semiconductor die to an opposite side of the semiconductor die, the semiconductor die including contact pads configured to receive solder bumps configured to carry signals from the semiconductor die to outside of the sensor package; and
a second pass through hole extending from one side of the sensor package to an opposite side of the sensor package, the second pass through hole being aligned with the first pass through hole and configured to receive a current-carrying conductor,
wherein the at least one current sensor is configured to sense current flow in the current-carrying conductor received in the second pass through hole.

11. The sensor package of claim 10, wherein the current-carrying conductor received in the second through hole is galvanically isolated from the sensor package.

12. The sensor package of claim 10, further comprising a lead frame attached to the semiconductor die, the lead frame including a third pass through hole aligned with the first pass through hole extending from the one side of the semiconductor die to the opposite side of the semiconductor die.

13. The sensor package of claim 12, wherein the lead frame extends from inside of the sensor package to a free end outside the sensor package and is configured to carry signals from the semiconductor die to the outside the sensor package.

14. The sensor package of claim 10, wherein a conducting material is disposed in the second through hole and bounded by an upper contact pad and a lower contact pad, the upper contact pad configured to be attached to an end of a current-carrying wire, the lower contact pad configured to receive a solder bump connection to complete a current path through the current-carrying wire across the sensor package.

15. The sensor package of claim 10, wherein the semiconductor die has a hexagonal shape.

16. The sensor package of claim 10, wherein the at least one current sensor includes one or more of an inductive sensor, a horizontal Hall effect sensor, and a vertical Hall effect sensor.

17. The sensor package of claim 16, wherein the at least one current sensor including one or more of an inductive sensor, a horizontal Hall effect sensor, and a vertical Hall effect sensor is configured to concurrently sense both AC and DC current flows through the current-carrying conductor received in the second pass through hole.

18. A method comprising:
disposing a current sensor in a semiconductor die, the sensor die having a pass through hole extending from one side of the semiconductor die to an opposite side of the semiconductor die;
disposing the semiconductor die about a conductor wire by passing the conductor wire through the hole in the semiconductor die from the one side of the semiconductor die to the opposite side of the semiconductor die; and
detecting, by the current sensor, a signal proportional to current flow in the conductor wire passing through the hole in the semiconductor die,
the detecting including at least one of detecting a Hall effect voltage in a sensor element or detecting an induced voltage in an inductive coil.

19. The method of claim 18, wherein the semiconductor die is packaged in a sensor package having a pass through hole extending from one side of the sensor package to an opposite side of the sensor package, and wherein placing the semiconductor die about the conductor wire includes placing the sensor package about the conductor wire with the conductor wire passing through the hole in the sensor package from the one side of the sensor package to the opposite side of the sensor package.

20. The method of claim 19, wherein placing the semiconductor die about the conductor wire includes galvanically isolating the sensor package from the conductor wire passing through the hole in the sensor package from the one side of the sensor package to the opposite side of the sensor package.

21. A current sensor package comprising:
a current sensor configured to sense current flow in a current carrying conductor that is disposed at least partially through a hole in the current sensor package; and
electrical insulation disposed between and the current carrying conductor and the current sensor, the electrical insulation blocking current flow from the current carrying conductor to the current sensor,
the current sensor sensing the current flow being configured to detect at least one of a Hall effect voltage in a sensor element or an induced voltage in an inductive coil.

22. The current sensor package of claim 21, wherein the current sensor includes one or more of an inductive sensor, a horizontal Hall effect sensor, and a vertical Hall effect sensor.

23. A semiconductor die comprising:
a semiconductor substrate of the semiconductor die;
a through hole in the semiconductor substrate extending from one side of the die to an opposite side of the semiconductor die, the through hole configured to receive a current-carrying conductor there through; and
at least one current sensor coupled to the semiconductor substrate and configured to sense current flow in the current-carrying conductor received in the through hole, the current sensor sensing the current flow being configured to detect at least one of a Hall effect voltage in a sensor element or an induced voltage in an inductive coil.

24. The semiconductor die of claim 23, wherein the at least one current sensor is configured to concurrently sense both AC and DC current flows through the current-carrying conductor received in the through hole.

* * * * *